US012635125B2

(12) United States Patent
Lee et al.

(10) Patent No.: US 12,635,125 B2
(45) Date of Patent: May 19, 2026

(54) METHOD OF FORMING THIN FILM, METHOD OF FORMING THIN FILM STRUCTURE, METHOD OF MANUFACTURING CAPACITOR, CAPACITOR AND MEMORY DEVICE INCLUDING THE SAME

(71) Applicants: SK hynix Inc., Icheon (KR); UNIVERSITY-INDUSTRY COOPERATION GROUP OF KYUNG HEE UNIVERSITY, Yongin (KR)

(72) Inventors: Min Yung Lee, Icheon (KR); Woojin Jeon, Hwaseong (KR); Yewon Kim, Hanam (KR)

(73) Assignees: SK hynix Inc., Icheon (KR); University-Industry Cooperation Group of Kyung Hee University, Yongin (KR)

( * ) Notice: Subject to any disclaimer, the term of this patent is extended or adjusted under 35 U.S.C. 154(b) by 606 days.

(21) Appl. No.: 18/062,518

(22) Filed: Dec. 6, 2022

(65) Prior Publication Data

US 2023/0180459 A1      Jun. 8, 2023

(30) Foreign Application Priority Data

Dec. 7, 2021      (KR) ........................ 10-2021-0174280

(51) Int. Cl.
*H10B 12/00*          (2023.01)

(52) U.S. Cl.
CPC .................................. *H10B 12/315* (2023.02)

(58) Field of Classification Search
None
See application file for complete search history.

(56) References Cited

U.S. PATENT DOCUMENTS

| 8,765,569 B2 | 7/2014 | Chen et al. | |
| 2011/0204475 A1* | 8/2011 | Rui ................... | H01L 21/02186 |
| | | | 257/532 |
| 2013/0140675 A1 | 6/2013 | Chen et al. | |

FOREIGN PATENT DOCUMENTS

JP          2013102157 A      5/2013

* cited by examiner

*Primary Examiner* — Asok K Sarkar

(57)          ABSTRACT

A method for forming a thin film structure may include providing a TiN member, forming a $MoO_2$ thin film on the TiN member by using a first ALD (atomic layer deposition) process using ozone ($O_3$) as a reactant, and forming a $TiO_2$ thin film having a rutile crystal structure on the $MoO_2$ thin film by using a second ALD process. The $MoO_2$ thin film may have a thickness of about 10 nm or less. A $TiO_2$ element layer may be further formed between the TiN member and the $MoO_2$ thin film. The $TiO_2$ element layer may have a nanodot array shape or a continuous layer structure. The $TiO_2$ thin film may have a dielectric constant of 100 or more. The method of manufacturing a capacitor may further include forming a conductive material layer on the $TiO_2$ thin film.

7 Claims, 13 Drawing Sheets

40

30

20

15

10

< Rutile TiO$_2$ >

< Anatase TiO$_2$ >

*FIG. 15*

Upper electrode (230)

Dielectric layer (220)

200

Capacitor

Bottom electrode (210)

Bit-line (150)

Transistor (100)

1

METHOD OF FORMING THIN FILM, METHOD OF FORMING THIN FILM STRUCTURE, METHOD OF MANUFACTURING CAPACITOR, CAPACITOR AND MEMORY DEVICE INCLUDING THE SAME

CROSS-REFERENCE TO RELATED APPLICATION

The present application claims, under 35 U.S.C. § 119(a), the benefit of Korean application No. 10-2021-0174280, filed on, Dec. 7, 2021, which is herein incorporated by reference in its entirety.

BACKGROUND

1. Field

Embodiments of the present disclosure relate to a method for forming a material film, a method of forming a film structure, a device to which the same is applied, and a method for manufacturing the same, and more particularly, to a method of forming a thin film, a method of forming a thin film structure, a method of manufacturing a capacitor, a capacitor, and a memory device including the same.

2. Description of the Related Art

Recently, as scale-down of memory devices is accelerated, development and performance improvement of a material having high dielectric constant (that is, a high-k material) are desirable to maintain the capacitance of the capacitor. $TiO_2$, which is a strong candidate among high-k materials, has the advantage that it may theoretically have a high dielectric constant of about 100 or more in a rutile crystal phase. However, $TiO_2$ obtained through the actual deposition process is not formed as a rutile crystal phase, but is formed as an anatase crystal phase which is one of polymorphs. The dielectric constant of the anatase crystal phase is lowered to about 40 as compared to the dielectric constant of the rutile crystal phase. In order to obtain $TiO_2$ in the rutile crystal phase (or referred to as rutile $TiO_2$) while minimizing the generation of the anatase crystal phase, an electrode layer having a crystal phase similar to that of rutile $TiO_2$ may be used as an underlying film for the rutile crystal phase $TiO_2$.

According to the treatise titled "Titanium dioxide thin films for next-generation memory devices" containing the present inventors (J. Mater. Res., Vol. 28 No. 3, which was published on Feb. 14, 2013), ruthenium (Ru) has been proposed as an electrode film for forming rutile $TiO_2$. It has been reported that when $TiO_2$ is deposited on a Ru electrode in a specific manner, $RuO_2$ is formed on the Ru electrode and $TiO_2$ may be crystallized into a rutile phase thereon, and the dielectric constant is improved to about 83.

However, in the case of Ru, the redox resistance is weak, and when oxidized into $RuO_2$, as the crystal growth of $RuO_2$ is biased toward a specific direction, so that $RuO_2$ is formed as a form of a rod, and in the oxidation state of $RuO_4$, it has strong volatility. As a result, the surface roughness of an electrode may be degraded by subsequent processing. This causes a problem of deteriorating overall characteristics of a capacitor.

Accordingly, a method for manufacturing a capacitor is required which may be easily applied to semiconductor devices such as DRAM or variable resistance devices while overcoming the problems and limitations of $TiO_2$ formation using the existing Ru electrode and having high dielectric constant characteristics and improved performance.

SUMMARY

An object of embodiments of the present disclosure is to provide a thin film forming method capable of easily forming a $TiO_2$ thin film having a rutile crystal structure having excellent characteristics such as high dielectric constant.

Another object of the present disclosure is to provide a method of manufacturing a capacitor having excellent performance by applying the thin film forming method.

Another object of the present disclosure is to provide a capacitor manufactured by the above method and a semiconductor device to which the same is applied.

The objects to be solved by the present disclosure are not limited to the above-mentioned ones, and other objects not mentioned will be understood by those skilled in the art from the following description.

According to an embodiment of the present disclosure, there is provided a method of forming a thin film, the method comprising: providing a TiN member; forming a $MoO_2$ thin film on the TiN member by using a first ALD (atomic layer deposition) process using ozone ($O_3$) as a reactant; and forming a $TiO_2$ thin film having a rutile crystal structure on the $MoO_2$ thin film by using a second ALD process.

The $MoO_2$ thin film may have a thickness of about 10 nm or less.

A $TiO_2$ element layer may be further formed between the TiN member and the $MoO_2$ thin film.

The $TiO_2$ element layer may have a nanodot array shape or a continuous layer structure.

The $TiO_2$ thin film may have a dielectric constant of 100 or more.

The first ALD process may include supplying a Mo precursor into a chamber in which the TiN member is disposed; purging the chamber with a first purge gas; supplying the reactant into the chamber; and a step for purging the chamber with a second purge gas.

The second ALD process may include supplying a Ti precursor into a chamber in which the TiN member on which the $MoO_2$ thin film is formed is disposed; purging the chamber with a third purge gas; supplying a second reactant into the chamber; and purging the chamber with a fourth purge gas.

According to another embodiment of the present disclosure, there is provided a method of manufacturing a capacitor, the method comprising: preparing a TiN member; forming a $MoO_2$ thin film on the TiN member by using a first ALD (atomic layer deposition) process using ozone ($O_3$) as a reactant; forming a $TiO_2$ thin film having a rutile crystal structure on the $MoO_2$ thin film by using a second ALD process; and forming a conductive material film on the $TiO_2$ thin film, wherein at least a portion of the TiN member and the $MoO_2$ thin film constitutes a first electrode of the capacitor, the $TiO_2$ thin film constitutes a dielectric film of the capacitor, and the conductive material layer constitutes a second electrode of the capacitor.

The $MoO_2$ thin film may have a thickness of about 10 nm or less.

A $TiO_2$ element layer may be further formed between the TiN member and the $MoO_2$ thin film.

The $TiO_2$ element layer may have a nanodot array shape or a continuous layer structure.

The $TiO_2$ thin film may have a dielectric constant of 100 or more.

The first ALD process may include supplying a Mo precursor into a chamber in which the TiN member is disposed; purging the chamber with a first purge gas; supplying the reactant into the chamber; and purging the chamber with a second purge gas.

The second ALD process may include supplying a Ti precursor into a chamber in which the TiN member on which the $MoO_2$ thin film is formed is disposed; purging the chamber with a third purge gas; supplying a second reactant into the chamber; and purging the chamber with a fourth purge gas.

According to another embodiment of the present disclosure, there is provided a capacitor comprising a TiN member; a $MoO_2$ thin film disposed on the TiN member; a $TiO_2$ thin film disposed on the $MoO_2$ thin film and having a rutile crystal structure; and a conductive material film disposed on the $TiO_2$ thin film, wherein at least a portion of the TiN member and the $MoO_2$ thin film constitutes a first electrode of the capacitor, the $TiO_2$ thin film constitutes a dielectric film of the capacitor, and the conductive material film constitutes a second electrode of the capacitor.

The $MoO_2$ thin film may have a thickness of about 10 nm or less.

A $TiO_2$ element layer may be further formed between the TiN member and the $MoO_2$ thin film.

The $TiO_2$ element layer may have a nanodot array shape or a continuous layer structure.

The $TiO_2$ thin film may have a dielectric constant of 100 or more.

According to another embodiment of the present disclosure, there is provided a memory device including the above-described capacitor as a data storage member.

The memory device may be a DRAM (dynamic random access memory).

According to embodiments of the present disclosure, it is possible to implement a thin film forming method capable of easily forming a $TiO_2$ thin film having a rutile crystal structure having excellent characteristics such as high dielectric constant and the like. In addition, according to embodiments of the present disclosure, a capacitor having excellent performance may be manufactured by applying the thin film forming method.

The capacitor according to an embodiment of the present disclosure may be easily applied to a semiconductor device, for example, a memory device such as DRAM, and in this case, it may act very advantageously to improve the integration degree and performance of the memory device.

BRIEF DESCRIPTION OF THE DRAWINGS

FIG. 15 is a diagram illustrating an example configuration of a DRAM device to which a capacitor according to an embodiment of the present disclosure may be applied.

DETAILED DESCRIPTION

Figures 1A, 1B, 1C, 1D:
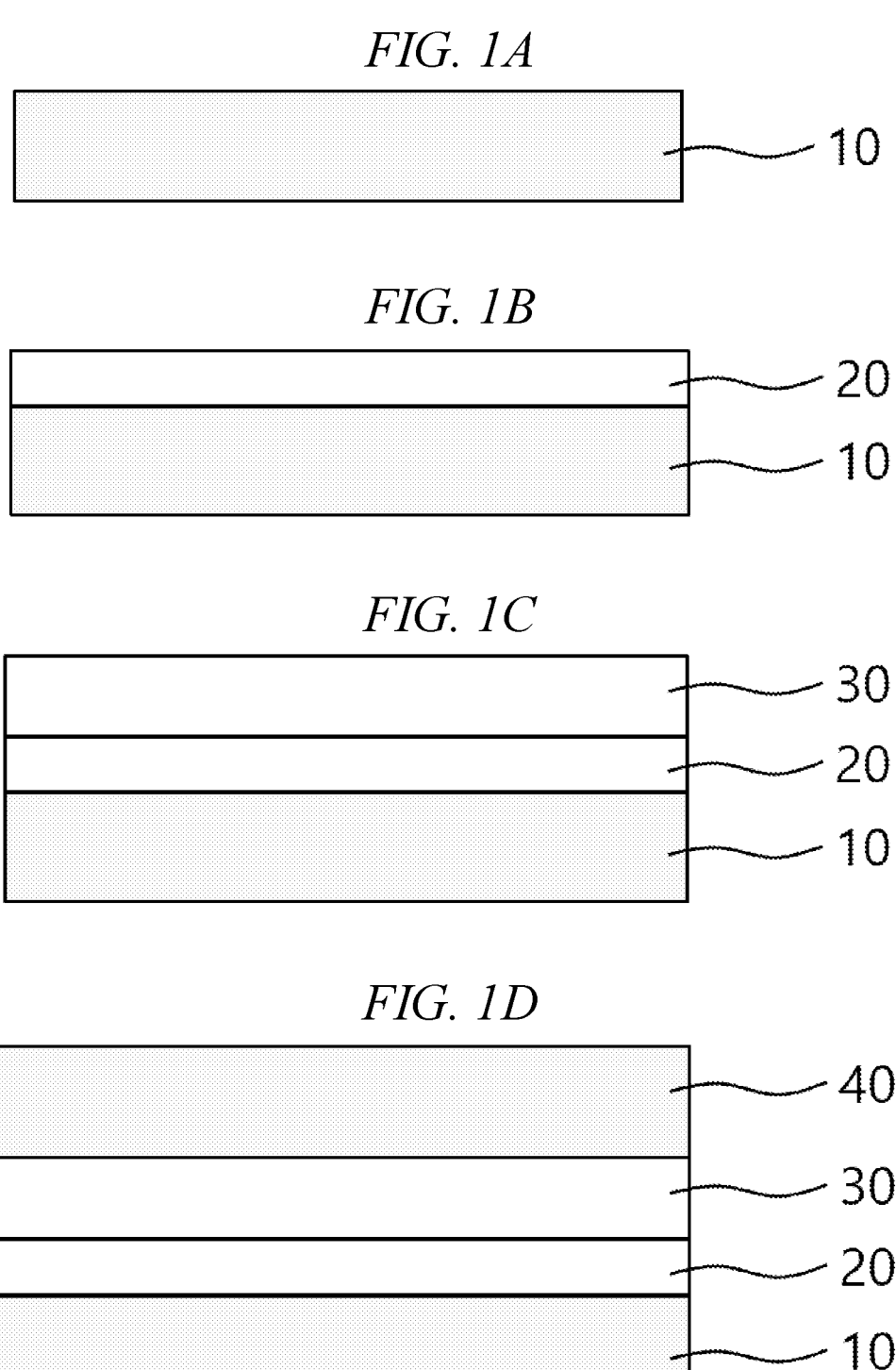
FIGS. 1A, 1B, 1C, and 1D are cross-sectional diagrams illustrating a method of forming a thin film structure according to an embodiment of the present disclosure, and a method of manufacturing a capacitor to which the method is applied.

Hereinafter, embodiments of the present disclosure will be described in detail with reference to the accompanying drawings.

These embodiments of the present disclosure to be described below are provided to more clearly explain various embodiments of the present disclosure to those having common knowledge in the related art, and the scope of embodiments of the present disclosure are not limited by the following embodiments. The following embodiments may be modified in many different forms.

The terminology used herein may be used to describe specific embodiments, rather than being used to limit various embodiments of the present disclosure. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using the disclosed technology unfairly.

Hereinafter, the embodiments of the present disclosure will be described in detail with reference to the accompanying drawings. The size or the thickness of the regions or the parts illustrated in the accompanying drawings may be slightly exaggerated for clarity and convenience of description. The same reference numerals refer to the same elements throughout the detailed description.

FIG. 1A to FIG. 1D are cross-sectional diagrams illustrating a method of forming a thin film structure according to an embodiment of the present disclosure, and a method of manufacturing a capacitor to which the method is applied.

Referring to FIG. 1A, a conductive member (e.g., a titanium nitride (TiN) member) 10 may be provided. The TiN member 10 may be a TiN thin film formed on a surface of a predetermined structure such as a silicon substrate or may be a TiN structure itself, which may be referred to as a 'TiN underlayer' or a 'TiN substrate'. The TiN member 10 may be formed on a predetermined base substrate (not shown). Here, although a case where the TiN member 10 has a flat layer structure is illustrated, this is merely an example and a shape of the TiN member 10 may have a three-dimensional structure having a predetermined aspect ratio. The TiN member 10 may be a conductive layer. The TiN member 10 may be used as an electrode.

Referring to FIG. 1B, a first thin film (e.g., $MoO_2$ thin film) 20 may be formed on the TiN member 10. The $MoO_2$ thin film 20 may be formed by using a first atomic layer deposition (ALD) process using ozone $O_3$ as a reactant (i.e., a reaction material). The $MoO_2$ thin film 20 may be formed by performing the first ALD process using $O_3$ as a reactant on the TiN member 10. Among Mo oxides, since $MoO_2$ is a meta-stable phase and $MoO_3$ is the most stable phase, $MoO_3$ is formed by a general ALD deposition method and it is difficult to form $MoO_2$. However, in an embodiment of the present disclosure, the $MoO_2$ thin film 20 may be easily formed by performing the first ALD process using $O_3$ as a reactant on the TiN member 10. The $MoO_2$ thin film 20 may be formed through the ALD process by using an underlying film (i.e., the TiN member 10) having a specific material composition and/or structure and using a specific reactant (i.e., $O_3$). The $MoO_2$ thin film 20 may be formed by the material effect of the TiN member 10 and the effect/role of $O_3$ reactant, and through appropriate condition control of the first ALD process.

In one embodiment of the present disclosure, the $MoO_2$ thin film 20 may have a thickness of about 10 nm or less. For example, the $MoO_2$ thin film 20 may have a thickness of 0.1 nm to 10 nm, wherein the thickness of 0.1 nm may be a thickness of a single layer which is formed by one cycle of an atomic layer deposition process which may be formed as a physically continuous film to act as a template layer for forming a $TiO_2$ thin film 30 having a rutile crystal structure to be described later. In some embodiments, the $MoO_2$ thin film 20 may have a thickness of 0.3 nm to 10 nm. In terms of the lattice constant, a good $MoO_2$ thin film 20 may be formed at about 0.3 nm or more. When the thickness of the $MoO_2$ thin film 20 increases by more than about 10 nm, the surface effect of the TiN member 10 may decrease while the thickness of the $MoO_2$ thin film 20 increases in the first ALD process, and as a result, formation of the metastable $MoO_2$ may be difficult.

The $MoO_2$ thin film 20 may be a conductive layer having excellent conductivity. Accordingly, the $MoO_2$ thin film 20 may function as a kind of electrode having a predetermined work function (about 5.5 eV). The $MoO_2$ thin film 20 acts as an electrode layer of a double-layer structure together with the underlying TiN member 10, and there is an effect that the work function of the double-layer structure is increased as compared to the work function of the TiN single electrode (about 4.3 eV). The improvement of the work function has an advantage in that it is possible to improve the leakage current characteristics due to thermionic emission of the $TiO_2$ thin film 30 of a capacitor to be manufactured. Since this work function improvement effect is well represented even when the thickness of the $MoO_2$ thin film 20 is about 2 nm or less, the minimum thickness of the $MoO_2$ thin film 20 to act as a template layer may be in a range of 0.1 nm to 2 nm.

In the present specification, the expression 'thin film' in the term of the '$MoO_2$ thin film' may correspond to a general 'thin film' used in a typical semiconductor device or semiconductor process, and may not be a term limiting the thickness thereof. The term 'thin film' used in the specification of the present disclosure may be replaced with 'material film' or 'film' or 'layer'.

Referring to FIG. 1C, a second thin film (e.g., crystalline $TiO_2$ thin film) 30 may be formed on the $MoO_2$ thin film 20. The $TiO_2$ thin film 30 may be formed using the second ALD process. The $TiO_2$ thin film 30 may have a rutile crystal structure. The $TiO_2$ thin film 30 having a rutile crystal structure may be formed by using the $MoO_2$ thin film 20 as a base layer and performing an ALD process thereon. This may be due to the 'template effect' of the $MoO_2$ thin film 20 by which the crystal structure of the $TiO_2$ thin film 30 is determined according to the crystal structure of the $MoO_2$ thin film 20 when the $TiO_2$ thin film 30 is grown on the $MoO_2$ thin film 20. Accordingly, when $TiO_2$ is deposited on the $MoO_2$ thin film 20, $TiO_2$ may be crystallized into a rutile crystal phase in an as-deposition state.

The lattice constant along an a-axis direction of the $MoO_2$ thin film 20 may be 0.486 nm, and the lattice constant along a c-axis direction may be 0.282 nm. In the $TiO_2$ thin film 30 having a rutile crystal structure, the lattice constant along the a-axis direction may be 0.458 nm, and the lattice constant along the c-axis direction may be 0.295 nm. The lattice mismatch between the $MoO_2$ thin film 20 and the $TiO_2$ thin film 30 having the rutile crystal structure is very low, that is, about −5.76% in the a-axis direction and 4.61% in the c-axis direction. Accordingly, the $TiO_2$ thin film 30 having a predominantly rutile crystal structure may be formed on the $MoO_2$ thin film 20 by the above-described template effect.

The $TiO_2$ thin film 30 having the rutile crystal structure may have a dielectric constant of about 100 or more. Accordingly, the $TiO_2$ thin film 30 may have very excellent thin film property such as high dielectric constant. The $TiO_2$ thin film 30 may have, for example, a thickness of about 5 nm to 60 nm, but embodiments of the present disclosure are not limited to the above range, and may be variously selected according to embodiments.

Referring to FIG. 1D, a conductive material layer 40 may be further formed on the $TiO_2$ thin film 30. The conductive material layer 40 may be an electrode layer. The conductive material layer 40 may have a single-layer structure or a multi-layer structure. As a specific example, the conductive material layer 40 may include a $RuO_2$ layer and a non-reactive conductive layer formed thereon, for example, a thin film of a noble metal such as tungsten, tungsten nitride, or platinum. For example, the conductive material layer 40 may have a platinum layer or a $RuO_2$/platinum double layer structure. Here, the thickness of the $RuO_2$ film may be, for example, about 2 nm to 30 nm, and the thickness of the Pt film may be, for example, about 4 nm to 100 nm. However, in embodiments of the present disclosure, the material, structure, and thickness conditions of the conductive material layer 40 may be variously changed. For example, the conductive material layer 40 may include TiN. In addition, any electrode material used in a general capacitor may be applied to the conductive material layer 40. In addition, the conductive material film 40, for example, may be formed by a sputtering method, but in the formation method according to an embodiment of the present disclosure, a chemical vapor deposition or an atomic layer deposition which is capable of coating a thin film of a uniform thickness on a three-dimensional shape with a relatively large aspect ratio may also be used.

If necessary, after the conductive material layer 40 is formed, a post-metallization annealing (PMA) process may be further performed. The PMA process may be performed at a temperature of about 600° C. to 900° C. in an $N_2$ atmosphere by using, for example, a rapid thermal annealing (RTA) process.

The stack layer structure shown in FIG. 1D may be a capacitor. In this case, at least a portion of the TiN member 10 and the $MoO_2$ thin film 20 may constitute a first electrode (lower electrode) of the capacitor. For example, the TiN member 10 and the $MoO_2$ thin film 20 may constitute the first electrode. The $TiO_2$ thin film 30 having a rutile structure may constitute a dielectric film of the capacitor. The conductive material layer 40 may constitute a second electrode (upper electrode) of the capacitor. As mentioned above, since the $TiO_2$ thin film 30 has a rutile crystal structure predominantly and a high dielectric constant. In this regard, the capacitor may exhibit very good performance. In addition, since the $MoO_2$ thin film 20 itself may be an electrode having excellent conductivity, it is preferable in that it does not cause a problem such as increasing the resistance of the first electrode.

Figures 2A, 2B:
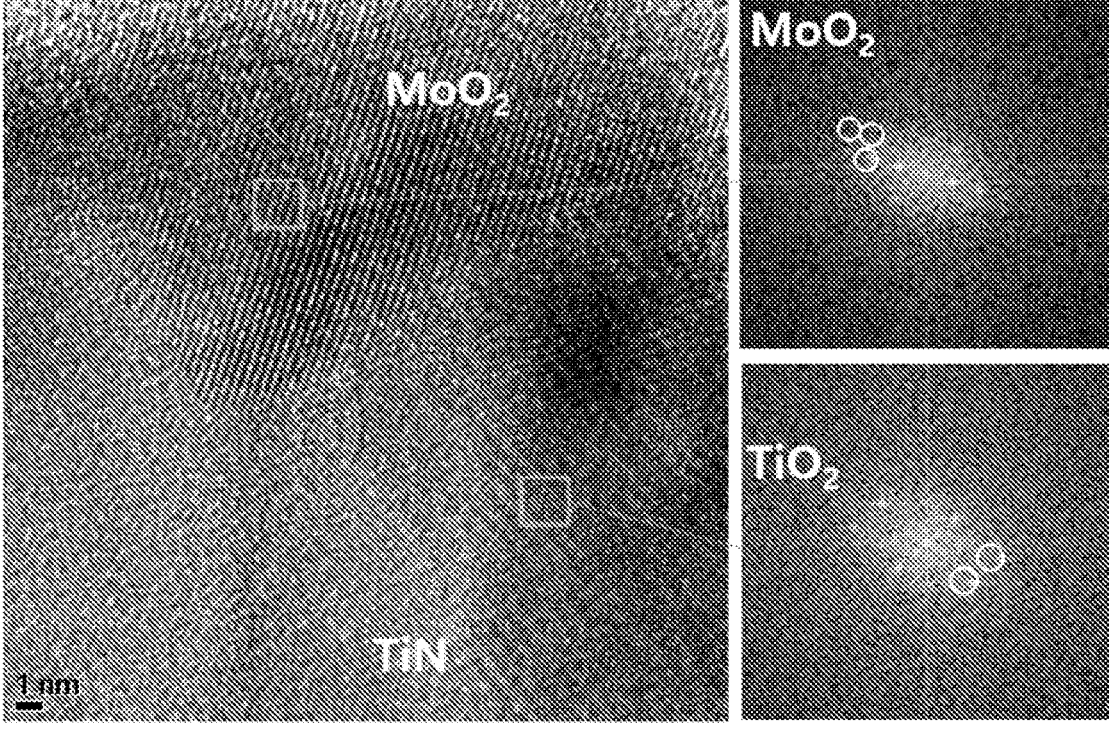
FIG. 2A is a cross-sectional diagram for explaining a method of forming a thin film structure according to another embodiment of the present disclosure, and a method of manufacturing a capacitor to which the method is applied.
FIG. 2B illustrates transmission electron microscopy analysis images of a stack structure of a TiN member and a $MoO_2$ thin film constituting a capacitor according to an embodiment of the present disclosure.

FIG. 2A is a cross-sectional diagram for explaining a method of forming a thin film structure according to another embodiment of the present disclosure, and a method of manufacturing a capacitor to which the method is applied, and FIG. 2B illustrates transmission electron microscopy analysis images of a stack structure of a TiN member 10 and a $MoO_2$ thin film 20 constituting a capacitor according to an embodiment of the present disclosure.

Referring to FIG. 2A, according to an embodiment of the present disclosure, a $TiO_2$ element layer 15 may be further formed between the TiN member 10 and the $MoO_2$ thin film 20. As a portion of a surface (an upper surface in the drawing) of the TiN member 10 is oxidized, the $TiO_2$ element layer 15 may be formed. When the first ALD process using an $O_3$ reactant is performed on the TiN member 10, a portion of the surface of the TiN member 10 may be slightly oxidized by the $O_3$ reactant, and accordingly, the $TiO_2$ element layer 15 may be formed. The presence or absence of the formation of the $TiO_2$ element layer 15, the structure, and characteristics thereof may be affected by controlling the conditions of the first ALD process.

According to an embodiment, the $TiO_2$ element layer 15 may form a layer structure. The layer structure may include a continuous layer and a non-continuous layer. After forming of the $TiO_2$ element layer 15, $MoO_2$ thin film 20 is formed on the $TiO_2$ element layer 15.

According to another embodiment, the $TiO_2$ element layer 15 may have a nanodot array having a given dispersion density induced by partial oxidation of the surface of the TiN member 10, or a structure in which a plurality of $TiO_2$ nanodots are arranged to be spaced apart from each other on the TiN member 10. Here, the $TiO_2$ nanodot may be a kind of 'nanoseed'. The $TiO_2$ nanodot may have a predetermined crystallinity. In the region between the plurality of $TiO_2$ nanodots, the TiN member 10 and the $MoO_2$ thin film 20 may be in direct contact.

Referring to FIG. 2B, the left image is a cross-sectional photograph of the TiN member 10 and the $MoO_2$ thin film 20 having a stacked crystal structure, the upper right image is a transmission electron diffraction pattern of the $MoO_2$ thin film 20, and the lower right image is a transmission electron diffraction pattern of the $TiO_2$ element layer 15. Referring to the transmission electron diffraction pattern of the $MoO_2$ thin film 20, a dot pattern due to $MoO_2$ was observed in the $MoO_2$ layer, and $MoO_3$ was not observed. Thus, it was observed that $MoO_2$ was formed with a high degree of crystallinity. In addition, referring to the transmission electron diffraction pattern of the $TiO_2$ element layer 15, it may be confirmed that the $TiO_2$ element layer 15 having a crystalline structure may be formed at the interface between the stacked TiN member 10 and the $MoO_2$ thin film 20. It is observed that the $TiO_2$ element layer 15 has a rutile and/or anatase crystal structure. In particular, since the $TiO_2$ element layer 15 of the rutile crystal structure has a relatively small lattice mismatch with the $MoO_2$ crystal, the $TiO_2$ element layer 15 according to an embodiment of the present disclosure affects formation and crystal growth of the $MoO_2$ thin film 20, and at the same time, the deposition of the $MoO_2$ thin film 20 may be made more easily.

Although the case where the $TiO_2$ element layer 15 has a nanodot array shape has been illustrated and described in the embodiment of FIGS. 2A and 2B, the structure of the $TiO_2$ element layer 15 may vary according to embodiments. For example, in some cases, the $TiO_2$ element layer 15 may have a continuous layer structure having a very small thickness. In an embodiment, the $TiO_2$ element layer 15 may have a thickness equal to or less than 1 nm. In this case, the $TiO_2$ element layer having the continuous layer structure may cover substantially the entire upper surface of the TiN member 10. According to the above-described embodiment, the $TiO_2$ element layer 15 may be a nanoseed, and may maximize a template effect of the TiN member 10 for forming the $MoO_2$ thin film 20.

Figure 2C:
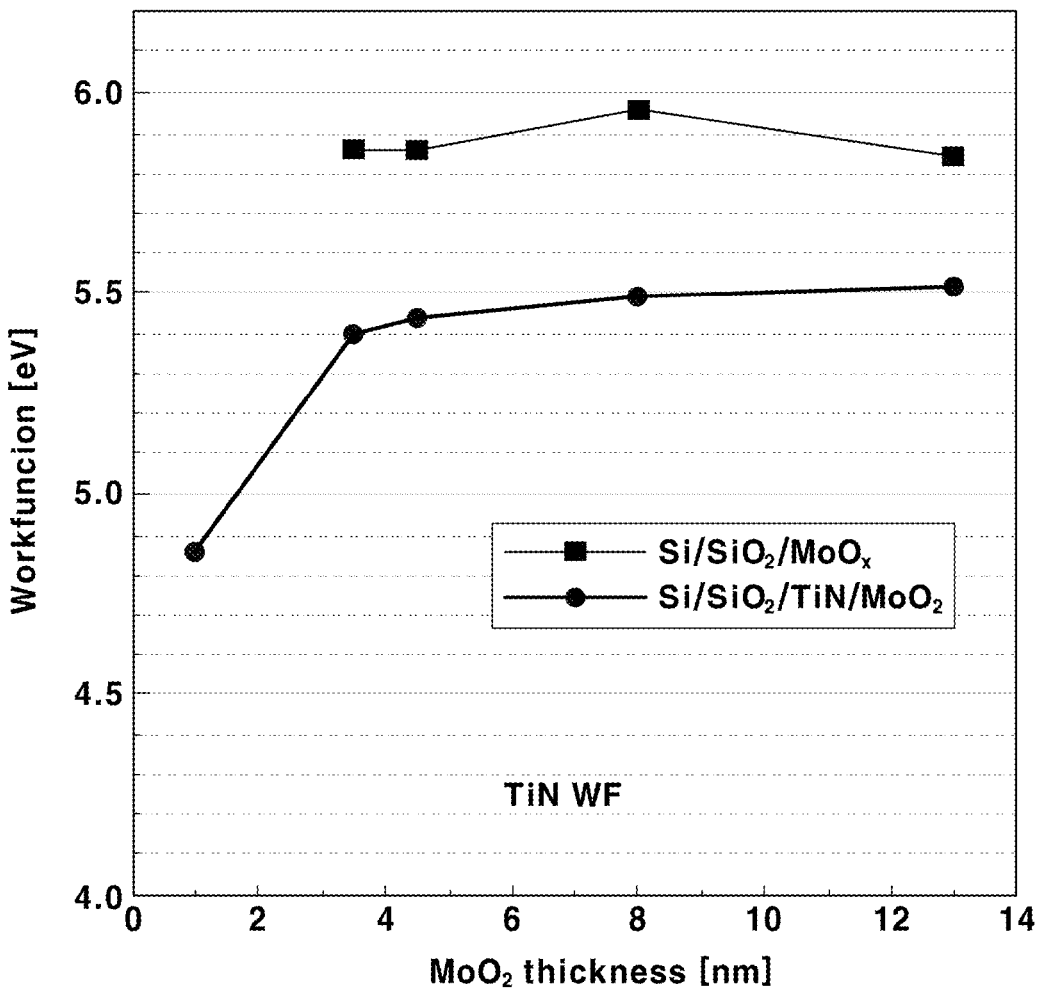
FIG. 2C is a graph illustrating a change in work function according to an increase in the thickness of a $MoO_2$ thin film in a $TiN/MoO_2$ structure, which is a double-layer structure of a TiN member and a $MoO_2$ thin film formed on the TiN member according to an embodiment of the present disclosure.

Referring to FIG. 2C, in the $TiN/MoO_2$ structure, which is a dual-layer structure of a TiN member and a $MoO_2$ thin film formed on the TiN member according to an embodiment of the present disclosure, as the thickness of the $MoO_2$ thin film increases, the work function gradually increases as compared to the work function of the TiN single layer and converges to 5.5 eV (refer to the circle type graph). This indicates that a $MoO_2$ thin film (Mo oxidation number is 4+) is formed on the TiN member in the embodiment of FIG. 2C. In particular, the work function of about 4.8 eV is measured at 1 nm in thickness of the $MoO_2$ thin film, which may indicate that the work function of the TiN member (about 4.3 eV) in the underlying layer is mixed and reflected, and at the same time, indicates that the $MoO_2$ thin film is effectively formed. On the other hand, the $MoO_x$ thin film formed on the $SiO_2$ film, which is a comparative example, showed a work function of about 5.8 eV, indicating that a $MoO_x$ thin film was formed as a $MoO_3$ thin film (Mo oxidation number is 6+), rather than as a $MoO_2$ thin film.

Figure 3:
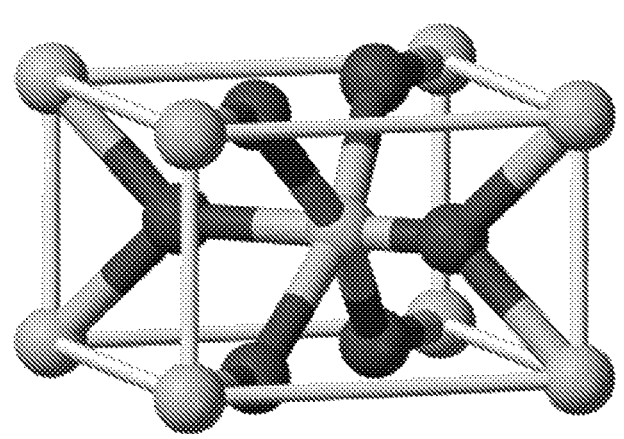
FIG. 3 is a diagram illustrating a crystal structure of rutile $TiO_2$ that may be formed in a method of forming a thin film according to an embodiment of the present disclosure.

FIG. 3 is a diagram illustrating a crystal structure of rutile $TiO_2$ that may be formed in a method of forming a thin film according to an embodiment of the present disclosure. Rutile $TiO_2$ may have a high dielectric constant k of about 80 or more, or about 100 or more. The dielectric constant k of rutile $TiO_2$ may be about 200 or less.

Figure 4:
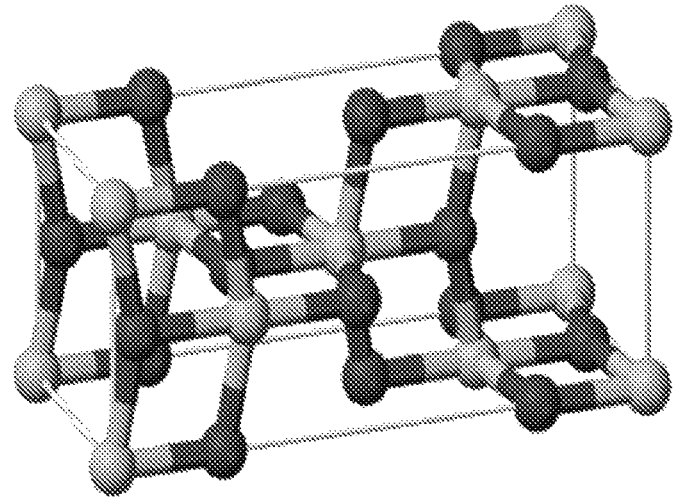
FIG. 4 is a diagram illustrating a crystal structure of anatase $TiO_2$.

FIG. 4 is a diagram illustrating a crystal structure of anatase $TiO_2$. Anatase $TiO_2$ may have a relatively low dielectric constant k of about 40.

Figure 5:
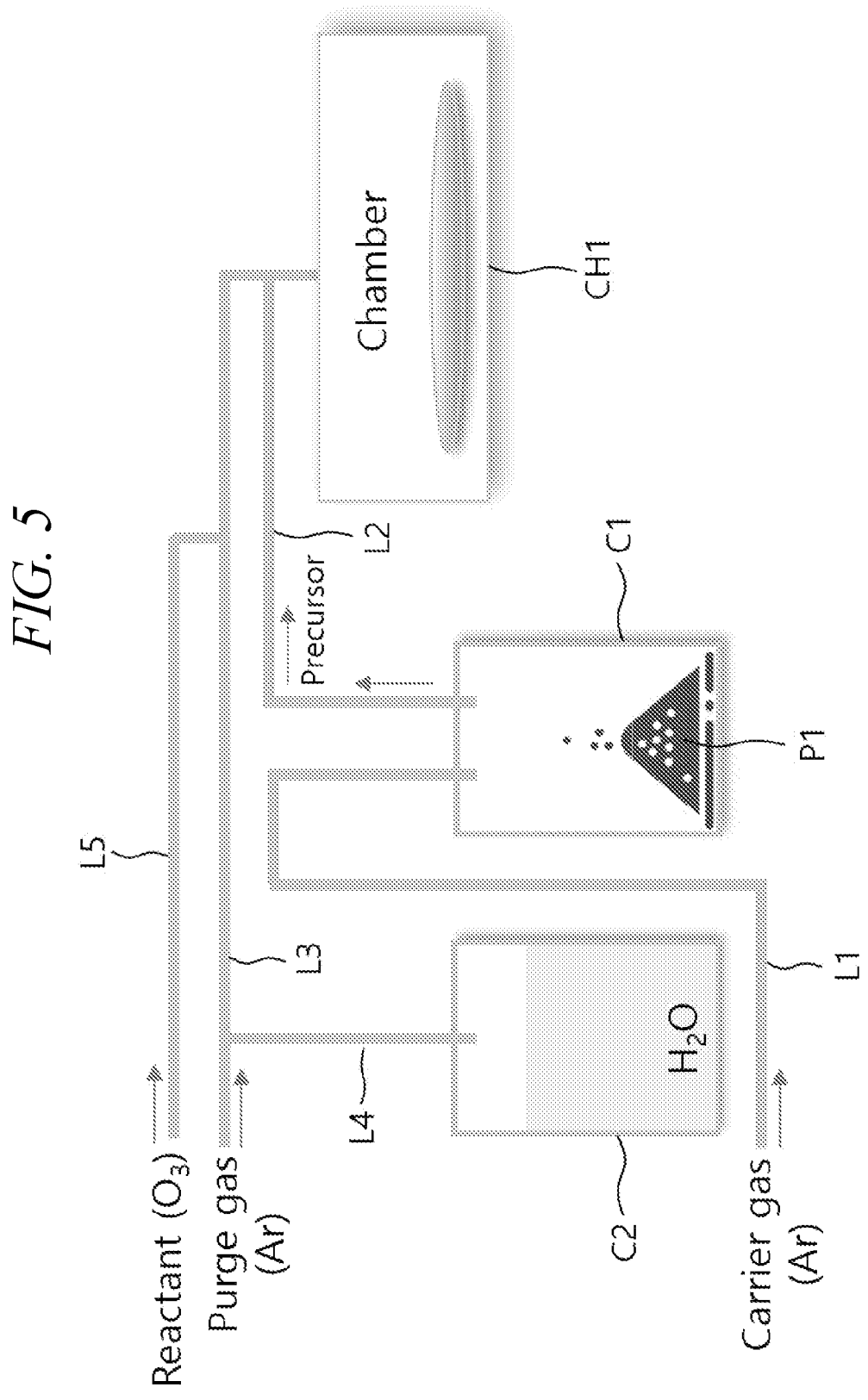
FIG. 5 is a diagram illustrating a configuration of an ALD device which may be used in a method of forming a thin film and a method of manufacturing a capacitor to which the method is applied according to an embodiment of the present disclosure.

FIG. 5 is a diagram illustrating a configuration of an ALD device which may be used in a method of forming a thin film and a method of manufacturing a capacitor to which the method is applied according to an embodiment of the present disclosure.

Referring to FIG. 5, a chamber CH1 in which thin film deposition is performed may be provided, and a first container C1 and a second container C2 connected to the chamber CH1 may be provided. A precursor P1 may be contained in the first container C1. Water ($H_2O$) may be contained in the second container C2. A first pipe L1 may be connected to the first container C1, and a second pipe L2 may be connected between the first container C1 and the chamber CH1. A carrier gas, for example, argon (Ar) gas, may be injected into the first container C1 through the first pipe L1, and the precursor P1 material vaporized may be supplied to the chamber CH1 through the second pipe L2 according to the flow of the carrier gas. A third pipe L3 connected to the chamber CH1 may be disposed, and a fourth pipe L4 may be connected between the third pipe L3 and the second container C2. A purge gas, as a non-limiting example, Ar gas may be supplied to the chamber CH1 through the third pipe L3. The use of the second container C2 and the $H_2O$ contained therein may be optional, and $H_2O$ may not be used in some embodiments of the present disclosure. In addition, a fifth pipe L5 connected to the chamber CH1 may be provided. The fifth pipe L5 may be connected to the third pipe L3, and may be connected to the chamber CH1 through the third pipe L3. A reactant (i.e., a reaction material) may be supplied to the chamber CH1 through the fifth pipe L5. Although the third pipe L3 for supplying the purge gas may be connected with the fourth pipe L4 and the fifth pipe L5 to form a common passage together as shown in the embodiment of FIG. 5, embodiments of the present disclosure are not limited thereto. In other embodiments, the third pipe L3 for supplying the purge gas may not form a common passage together with the fourth pipe L4 and the fifth pipe L5, and may be connected to the chamber CH1 alone.

As a precursor of Mo (i.e., Mo precursor) for forming a $MoO_2$ thin film in an embodiment of the present disclosure, for example, $Mo(CO)_6$ may be used, but other solid or liquid precursors or organic precursor gases may be used, and suitable solvents may also be used for dispersing these precursors. In addition, $O_3$ or $O_2$ plasma may be used as a reactant for the formation of the $MoO_2$ thin film.

ALD process conditions used when forming the $MoO_2$ thin film according to an embodiment of the present disclosure may be, for example, as follows.

<Precursor of Mo>: $Mo(CO)_6$ (powder, maintained at 35° C.)
<Deposition temperature>: 170° C.
<Pipe temperature>: 50° C.
<Purge gas>: Ar
<Reactant>: $O_3$=175~180 g/m³, 400 sccm However, the conditions for forming the $MoO_2$ thin film specifically disclosed herein are merely examples and may vary according to embodiments. For example, when using Mo-6-3 instead of $Mo(CO)_6$ as the precursor of Mo, the temperature may be about 300° C. In an embodiment, the deposition temperature may be sufficiently low to substantially prevent thermal decomposition of the precursor of Mo and sufficiently high to make the precursor of Mo react with the reactant. For example, the deposition temperature for forming the $MoO_2$ thin film may be in the range of 120° C. to 350° C., and it is preferable that it is in the range of 170° C. to 300° C.

A precursor of Ti (i.e., Ti precursor) for forming the $TiO_2$ thin film in an embodiment of the present disclosure may be, for example, $Ti(Me_5Cp)(OMe)_3$ (also referred to as Star-Ti). In addition, as a reactant for forming the $TiO_2$ thin film, for example, one of $O_3$, $H_2O$ and $O_2$ plasma may be used. Ar gas may be used as the carrier gas and the purge gas.

ALD process conditions used in forming the $TiO_2$ thin film in an embodiment of the present disclosure may be, for example, as follows.

<Precursor of Ti>: Star-Ti (maintained at 90° C.)
<Deposition temperature>: 300° C.
<Pipe temperature>: 100° C.
<Purge gas>: Ar
<Reactant>: $O_3$=175~180 g/m³, 400 sccm However, the conditions for forming the $TiO_2$ thin film specifically disclosed herein are merely examples and may vary according to embodiments.

Figure 6:
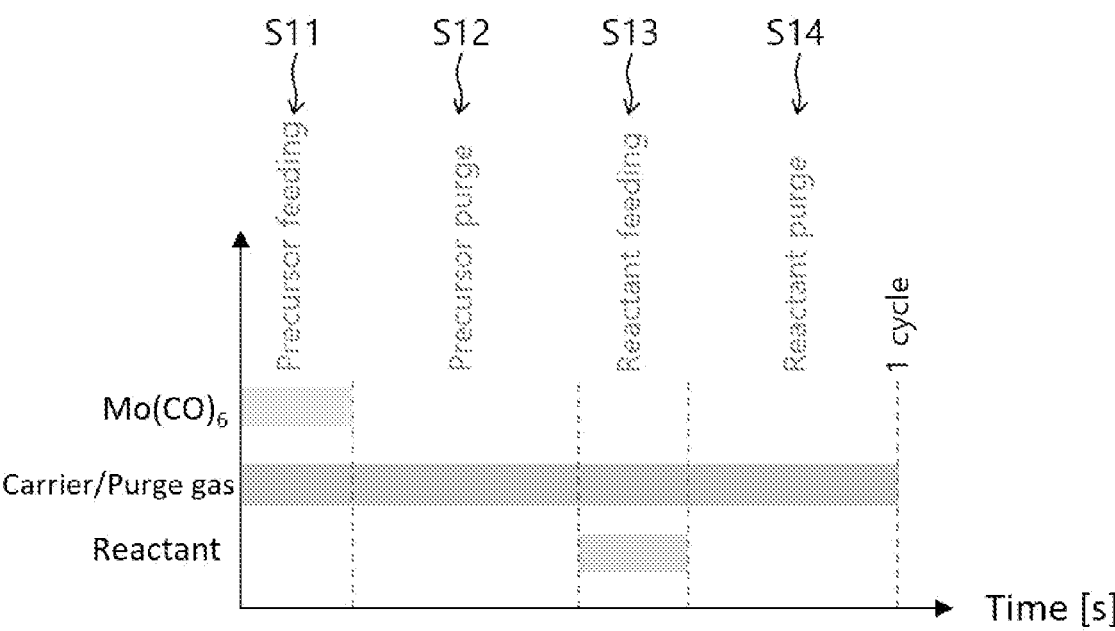
FIG. 6 is a graph illustrating an ALD process sequence for forming a $MoO_2$ thin film which may be applied to a method of forming a thin film according to an embodiment of the present disclosure.

FIG. 6 is a graph illustrating an ALD process sequence for forming a $MoO_2$ thin film which may be applied to a method of forming a thin film according to an embodiment of the present disclosure.

Referring to FIG. 6, the ALD process (or a first ALD process) for forming the $MoO_2$ thin film in an embodiment of the present disclosure may include a step S11 for supplying a Mo precursor into a chamber in which the TiN member is disposed, and a step S12 for purging the chamber with a first purge gas, a step S13 for supplying the reactant into the chamber, and a step S14 for purging the chamber with a second purge gas. Here, the Mo precursor may include, for example, $Mo(CO)_6$. The reactant (first reactant) may be $O_3$. The first and second purge gases may be, for example, Ar gas.

Figure 7:
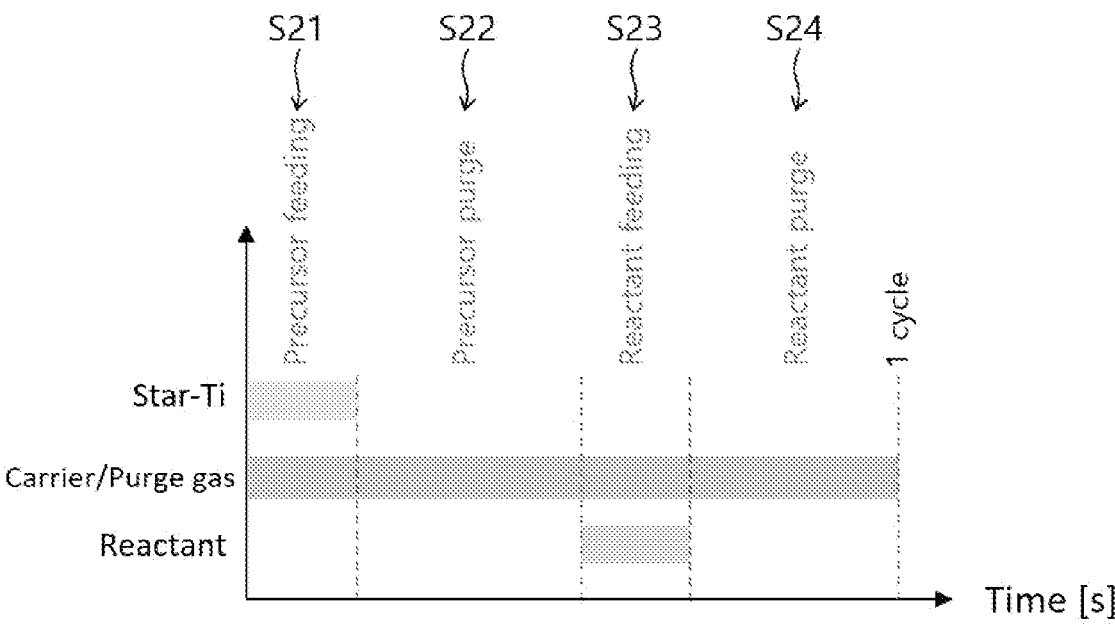
FIG. 7 is a graph illustrating an ALD process sequence for forming a $TiO_2$ thin film that may be applied to a method of forming a thin film according to an embodiment of the present disclosure.

FIG. 7 is a graph illustrating an ALD process sequence for forming a $TiO_2$ thin film that may be applied to a method of a forming a thin film according to an embodiment of the present disclosure.

Referring to FIG. 7, in an embodiment of the present disclosure, the ALD process (or a second ALD process) for forming the $TiO_2$ thin film may include a step S21 for supplying a Ti precursor into a chamber in which the TiN member on which the $MoO_2$ thin film is formed is disposed, a step S22 for purging the chamber with a third purge gas, a step S23 for supplying a second reactant into the chamber, and a step S24 for purging the chamber with a fourth purge gas. Here, the Ti precursor may include, for example, Star-Ti. The second reactant may be, for example, $O_3$. The third and fourth purge gases may be, for example, Ar gas.

Figure 8:
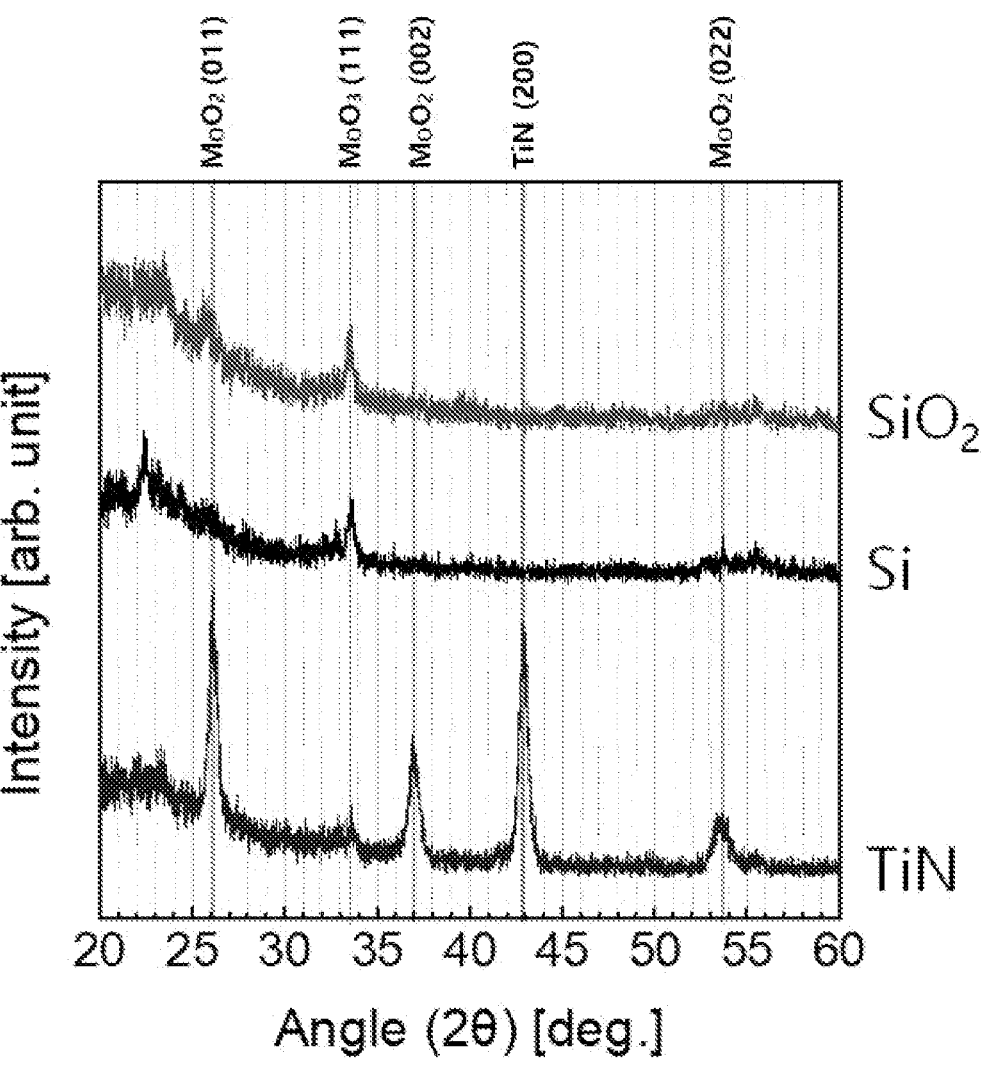
FIG. 8 illustrates influence of a substrate (underlayer) on the formation of a $MoO_2$ thin film.

FIG. 8 illustrates influence of a substrate (underlayer) on the formation of a $MoO_2$ thin film. More specifically, FIG.

8 shows XRD (X-ray diffraction) analysis result of Mo oxide formed when TiN, Si, and SiO$_2$ were used as a substrate (underlayer) for thin film deposition, respectively, and a Mo oxide deposition process using ALD was performed thereon.

Referring to FIG. 8, the MoO$_2$ thin film may be formed only on the TiN member (substrate), and when the Si and SiO$_2$ substrates are used, the MoO$_3$ thin film is formed. Therefore, as in embodiments of the present disclosure, when a TiN member is used as a substrate (underlayer), a MoO$_2$ thin film may be easily formed thereon. Preferably, when a TiN member is an underlayer having a (200) crystallographic plane or a (111) crystallographic plane, a MoO$_2$ thin film may be easily formed thereon.

The ALD process conditions related to the experiment of FIG. 8 were as follows.

<Process temperature>: 170° C.
<Sequence>: Mo(CO)$_6$/Purge/O$_3$/Purge=7/10/3/10 sec
<Reactant>: O$_3$, density=180 g/m$^3$, 400 sccm
<Post-deposition annealing>: 600° C., N$_2$, 30 sec @RTA (rapid thermal annealing)

Figure 9:
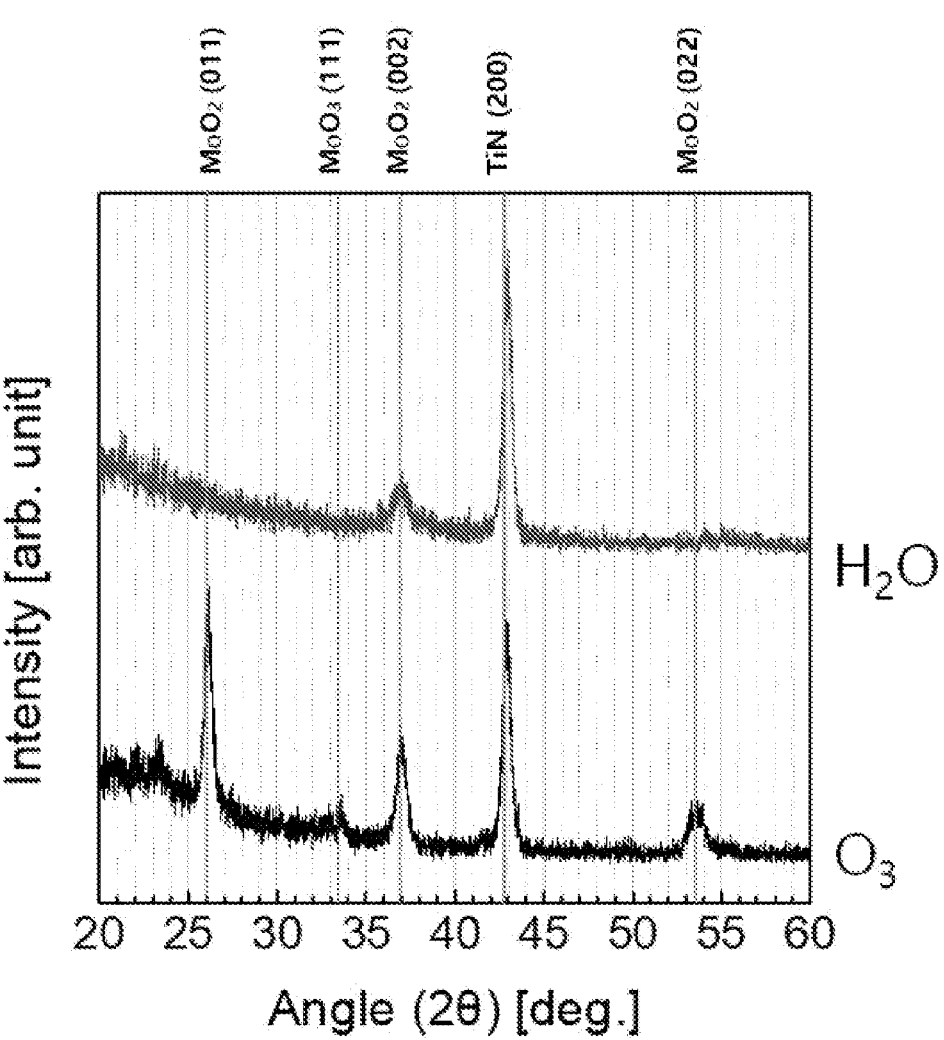
FIG. 9 illustrates the effect of a reactant on the formation of a $MoO_2$ thin film.

FIG. 9 illustrates the effect of a reactant on the formation of a MoO$_2$ thin film. More specifically, FIG. 9 shows an XRD analysis result of Mo oxide formed when each of O$_3$ and H$_2$O is used as a reactant for thin film deposition, and a Mo oxide deposition process using ALD is performed. At this time, the substrate (a base film) used was a TiN member.

Referring to FIG. 9, when O$_3$ is used as a reactant on a TiN substrate (underlayer), a distinct MoO$_2$ crystallization peak is observed, but when H$_2$O is used, the MoO$_2$ crystallization peak is insufficient. Therefore, as in an embodiment of the present disclosure, when O$_3$ is used as a reactant while using a TiN member as a substrate (underlayer), a MoO$_2$ thin film may be formed.

The ALD process conditions related to the experiment of FIG. 9 were as follows.

Figure 10:
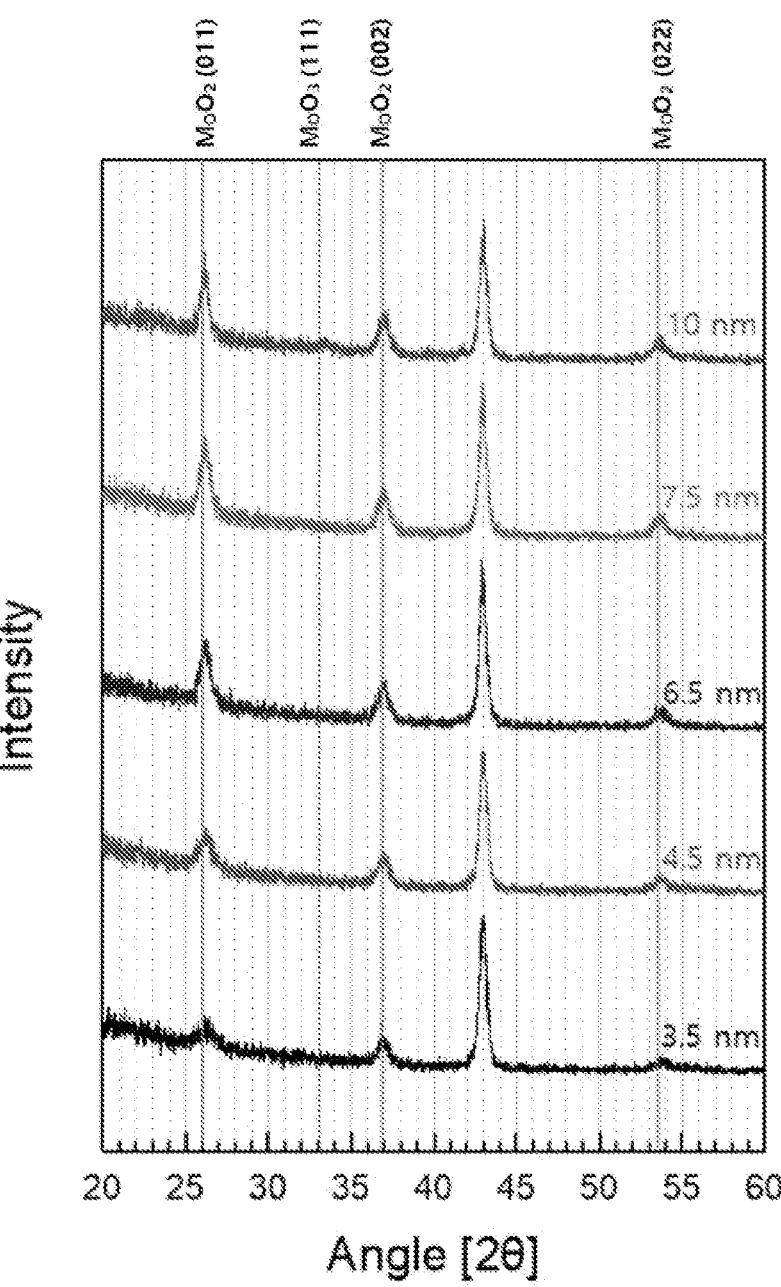
FIG. 10 illustrates the effect of a thickness of a $MoO_X$ thin film on the formation of the $MoO_X$ thin film.

<Process temperature>: 170° C.
<Sequence (1)>: Mo(CO)$_6$/Purge/O$_3$/Purge=7/10/3/10 sec
<Sequence (2)>: Mo(CO)$_6$/Purge/H$_2$O/Purge=5/10/1/20 sec
<Reactant (1)>: O$_3$, density=180 g/m$^3$, 400 sccm
<Reactant (2)>: H$_2$O (0.3 Torr @R.T) [R.T is room temperature.]
<Post-deposition annealing (1)_O$_3$>: 600° C., N$_2$, 30 sec @RTA
<Post-deposition annealing (2)_H$_2$O>: 700° C., N$_2$, 30 sec @RTA FIG. 10 illustrates the effect of a thickness of a MoO$_X$ thin film on the formation of the MoO$_X$ thin film. More specifically, FIG. 10 is an XRD analysis result measuring the composition (material/crystallinity) change according to the thickness of the MoO$_X$ thin film while depositing the MoO$_X$ thin film. In this case, a TiN member was used as the substrate (underlayer), and O$_3$ was used as the reactant.

Figure 11:
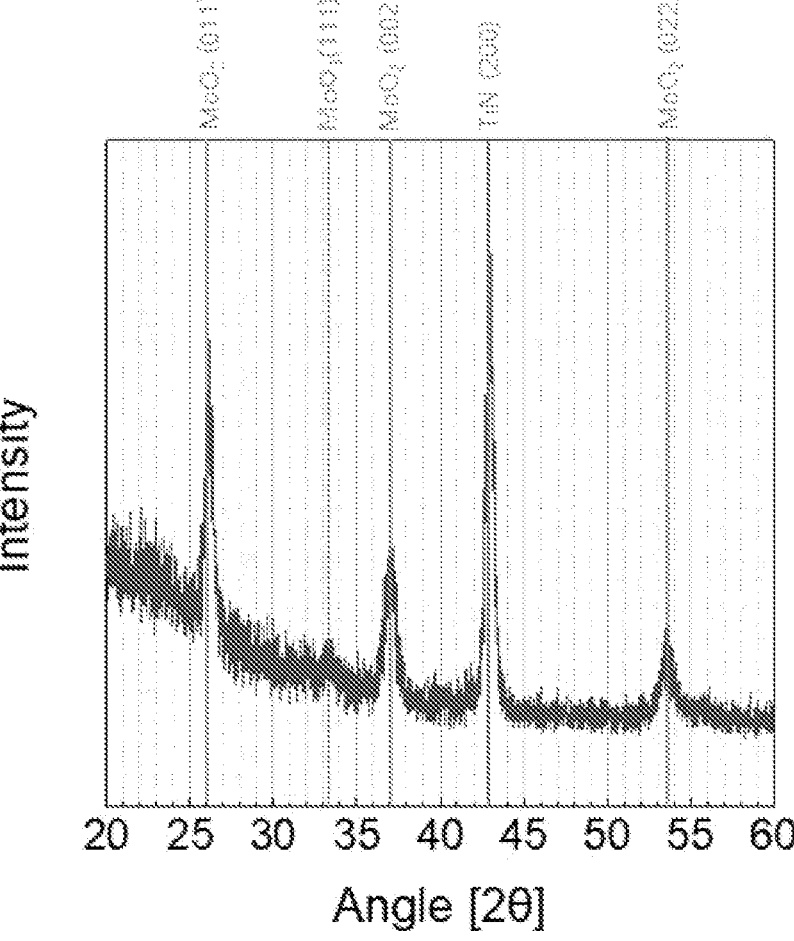
FIG. 11 is a graph showing an enlarged result when the thickness of the $MoO_X$ thin film in FIG. 10 is 10 nm.

FIG. 11 is a graph showing an enlarged result when the thickness of the MoO$_X$ thin film in FIG. 10 is 10 nm.

Referring to FIG. 10 and FIG. 11, it is confirmed that the MoO$_2$ thin film is formed at a thickness of about 10 nm or less. Formation of MoO$_3$ starts from a thickness of about 10 nm or more, and as the thickness increases, the ratio of MoO$_3$ may increase. Accordingly, the MoO$_2$ thin film may be obtained when it is formed on the TIN substrate to have a thickness of about 10 nm or less and O$_3$ is used as the reactant.

The ALD process conditions related to the experiment of FIG. 10 were as follows.

<Process temperature>: 170° C.

<Sequence>: Mo(CO)$_6$/Purge/O$_3$/Purge=7/10/3/10 sec
<Reactant>: O$_3$, density=180 g/m$^3$, 400 sccm
<Post-deposition annealing>: 600° C., N$_2$, 30 sec @RTA (rapid thermal annealing)

Figure 12:
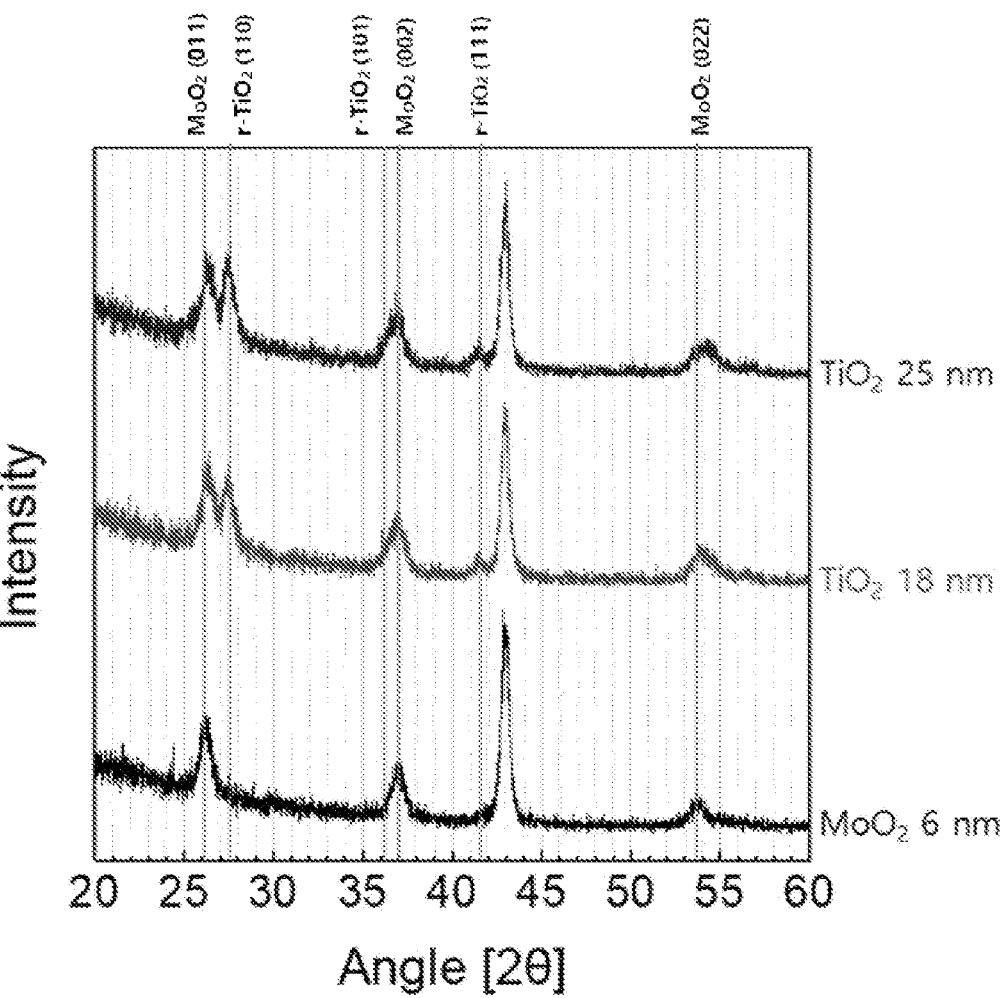
FIG. 12 is a graph showing XRD analysis results of a $MoO_2$ thin film and a $TiO_2$ thin film formed according to an embodiment of the present disclosure.

FIG. 12 is a graph showing XRD analysis results of a MoO$_2$ thin film and a TiO$_2$ thin film formed according to an embodiment of the present disclosure.

Figure 13:
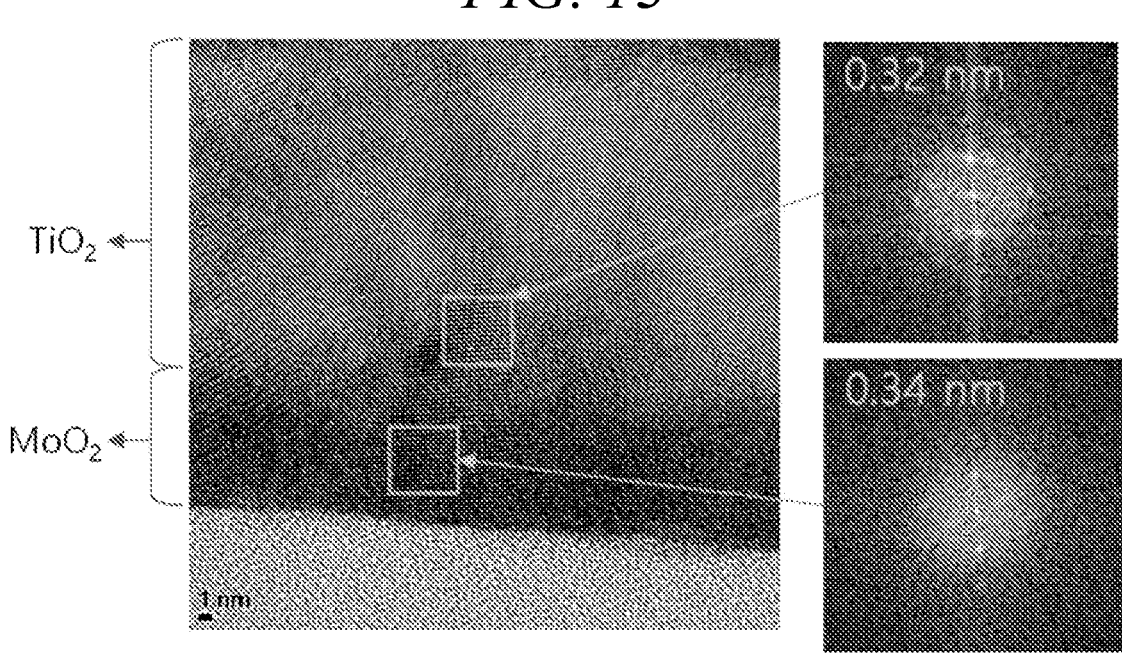
FIG. 13 is a diagram showing a transmission electron microscope (TEM) image of a $MoO_2$ thin film and a $TiO_2$ thin film formed according to an embodiment of the present disclosure, and analysis results obtained therefrom.

FIG. 13 is a diagram showing a transmission electron microscope (TEM) image of a MoO$_2$ thin film and a TiO$_2$ thin film formed according to an embodiment of the present disclosure, and analysis results obtained therefrom.

Referring to FIG. 12 and FIG. 13, it is observed that TiO$_2$ is crystallized into a rutile phase in an as-deposition state during TiO$_2$ deposition due to the template effect of the MoO$_2$ thin film to form a rutile TiO$_2$ thin film.

The conditions of the ALD process for forming the MoO$_2$ thin film of FIGS. 12 and 13 were as follows.

<Process temperature>: 170° C.
<Sequence>: Mo(CO)$_6$/Purge/O$_3$/Purge=7/10/3/10 sec
<Reactant>: O$_3$, density=180 g/m$^3$, 400 sccm
<Post-deposition annealing>: 600° C., N$_2$, 30 sec @RTA (rapid thermal annealing)

The conditions of the ALD process for forming the TiO$_2$ thin film of FIGS. 12 and 13 were as follows.

<Process temperature>: 300° C.
<Sequence>: Star-Ti/Purge/O$_3$/Purge=12/15/10/15 sec
<Reactant>: O$_3$, density=180 g/m$^3$, 400 sccm FIG. 14 is a graph (i.e., t$_{ox}$ vs t$_{phy}$ plot) illustrating an equivalent oxide film thickness (EOT) t$_{ox}$ according to a physical thickness t$_{phy}$ of a TiO$_2$ thin film formed according to an embodiment of the present disclosure.

Figure 14:
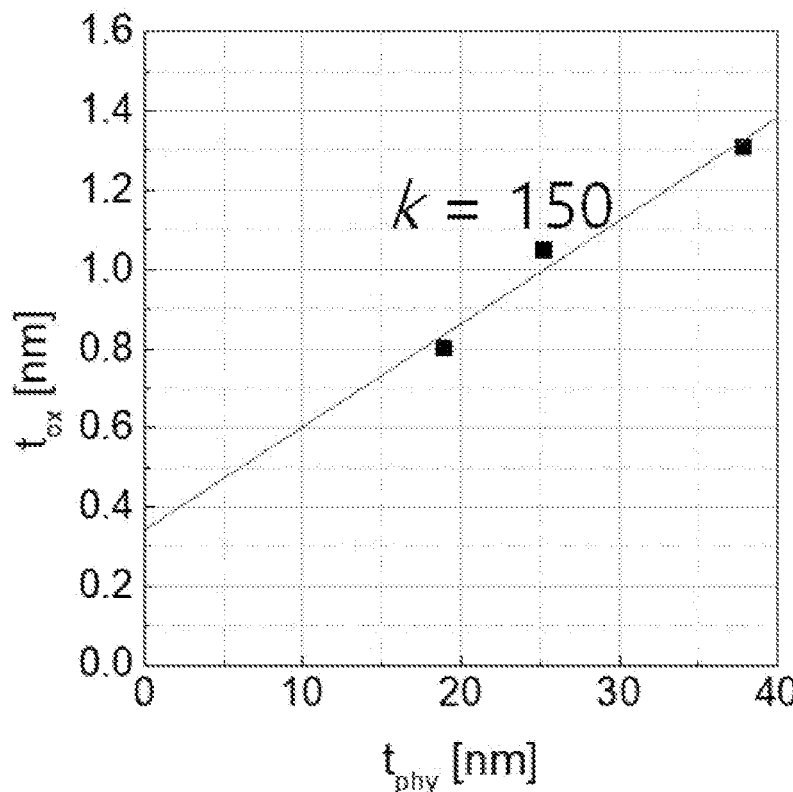
FIG. 14 is a graph illustrating an equivalent oxide film thickness $(EOT)(t_{ox})$ according to a physical thickness $(t_{phy})$ of a $TiO_2$ thin film formed according to an embodiment of the present disclosure.

Referring to FIG. 14, the TiO$_2$ thin film may have a characteristic of a high dielectric constant thin film of 100 or more. For example, the TiO$_2$ thin film in FIG. 14 may have a dielectric constant of about 150.

The capacitor structure manufactured according to the embodiment of the present disclosure, that is, the capacitor structure described with reference to FIG. 1D or FIG. 2 may be applied to various semiconductor devices. For example, a capacitor according to an embodiment of the present disclosure may be applied to a memory device using the capacitor as a data storage member. In an embodiment, the memory device may be a dynamic random access memory (DRAM). In order to apply the capacitor to DRAM, it may be desirable to manufacture the capacitor by using an ALD process. Conventional pulsed laser deposition (PLD) processes may not be applicable to the manufacturing process of highly integrated DRAM capacitors. Since the capacitor according to the embodiment of the present disclosure may be manufactured through an ALD process, it may be easily applied to a high-integrated DRAM. Even if FIG. 1D and FIG. 2 illustrate a capacitor with a simple planar structure, when applied as a DRAM capacitor, the capacitor according to an embodiment of the present disclosure may have various three-dimensional structures such as a cylinder shape and a cup shape.

Figure 15:
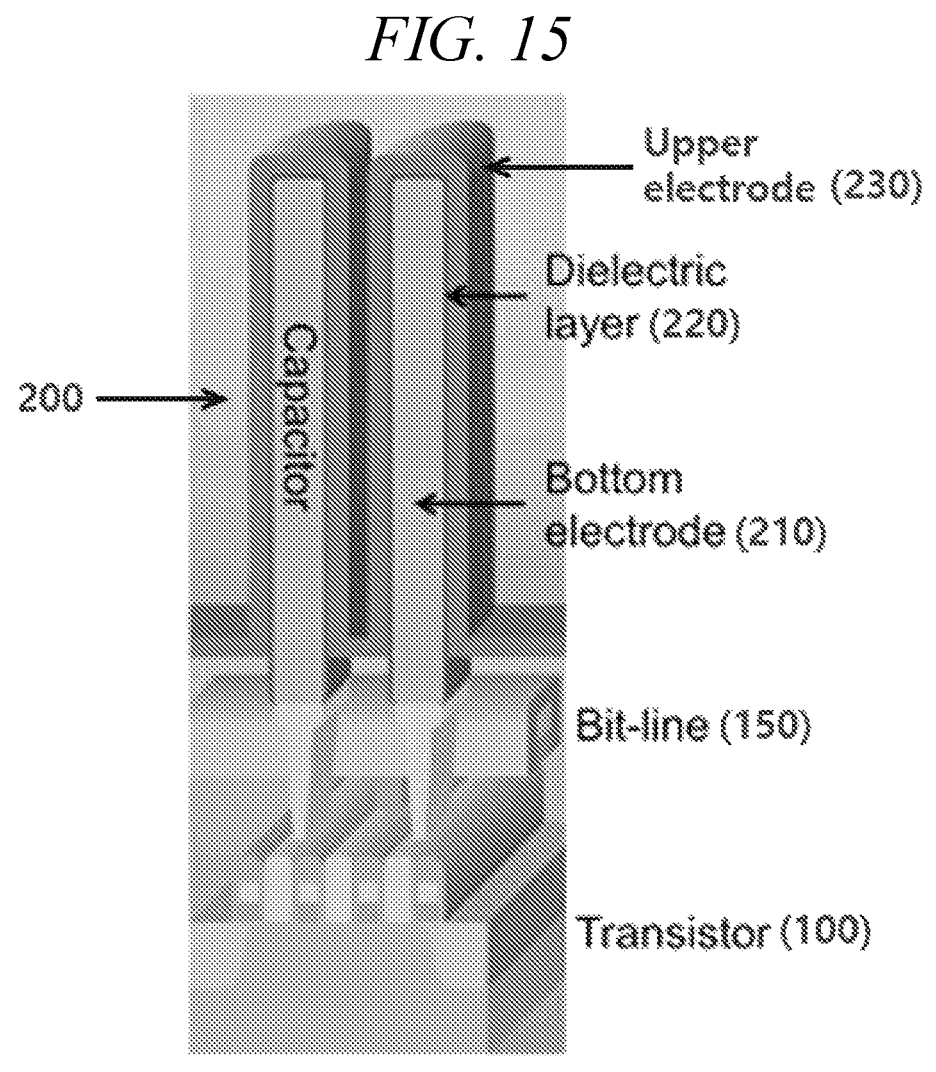

FIG. 15 is a diagram illustrating a configuration of a DRAM device to which a capacitor according to an embodiment of the present disclosure may be applied.

Referring to FIG. 15, a DRAM may include a cell transistor 100 and a capacitor 200 electrically connected thereto. The capacitor 200 may include a bottom electrode (i.e., lower electrode) 210, an upper electrode 230, and a dielectric layer 220 disposed therebetween. The TiN member 10 and the MoO$_2$ thin film 20 of the capacitor according to the embodiment described in FIG. 1D may be applied to the bottom electrode 210, the TiO$_2$ thin film 30 may be applied to the dielectric layer 220, and the conductive material layer 40 may be applied to the upper electrode 230. In addition, the TiN member 10, the TiO$_2$ element layer 15, and the MoO$_2$ thin film 20 of the capacitor according to the embodiment described with reference to FIGS. 2A and 2B may be applied to the bottom electrode 210, the TiO$_2$ thin film 30 may be applied to the dielectric layer 220, and the conductive material layer 40 may be applied to the upper electrode 230. However, the structure of the capacitor 200 shown in FIG. 15 is merely an example, and various modifications may be made. The capacitor according to an embodiments of the present disclosure may be applied to any capacitor structure used in the existing DRAM. When the capacitor according to such an embodiment of the present disclosure is applied to a DRAM, it may act advantageously in terms of integration degree and performance improvement. In addition, the capacitor according to the embodiment of the present disclosure may be applied to other memory devices or other semiconductor devices other than DRAM. The reference numeral 150 in FIG. 15 denotes a bit line.

According to the embodiments of the present disclosure described above, it is possible to implement a thin film forming method capable of easily forming a TiO$_2$ thin film having a rutile crystal structure having excellent characteristics such as high dielectric constant. In addition, according to embodiments of the present disclosure, a capacitor having excellent performance may be manufactured by applying the thin film forming method. The capacitor according to the above embodiment may be easily applied to a semiconductor device, for example, a memory device such as DRAM.

In the present specification, some embodiments of the present disclosure have been disclosed, and although specific terms are used, these may be used in a general sense to describe the technical content of the present disclosure and to help the understanding of embodiments of the present disclosure, and may not be used to limit various embodiments of the present disclosure. It will be apparent to those having common knowledge in the related art to which the present disclosure pertains that other modifications may be implemented in addition to the embodiments disclosed herein. In connection with the thin film forming method, the capacitor manufacturing method, the capacitor and the memory device including the same according to the embodiments described with reference to FIGS. 1A to 15, those having common knowledge in the related art will understand that various substitutions, changes, and modifications may be made without departing from the technological concepts of the present disclosure. Therefore, the scope of the invention should not be determined by the described embodiments, but should be determined by the technological concepts described in the claims.

EXPLANATION OF SYMBOLS

Explanation of Symbols for the Main Parts of the Drawing

10: TiN member
15: TiO$_2$ element layer
20: MoO$_2$ thin film
30: TiO$_2$ thin film
40: conductive material film
100: cell transistor
150: bit line
200: capacitor

What is claimed is:

1. A capacitor comprising:
a TiN member;
a MoO$_2$ thin film disposed on the TiN member;
a TiO$_2$ element layer disposed between the TiN member and the MoO$_2$ thin film;
a TiO$_2$ thin film disposed on the MoO$_2$ thin film and having a rutile crystal structure; and
a conductive material film disposed on the TiO$_2$ thin film,
wherein at least a portion of the TiN member and the MoO$_2$ thin film constitutes a first electrode of the capacitor, the TiO$_2$ thin film constitutes a dielectric film of the capacitor, and the conductive material film constitutes a second electrode of the capacitor.

2. The capacitor of claim 1, wherein the MoO$_2$ thin film has a thickness of 10 nm or less.

3. The capacitor of claim 1, wherein the TiO$_2$ element layer has a nanodot array shape or a continuous layer structure.

4. The capacitor of claim 1, wherein the TiO$_2$ thin film has a dielectric constant of 100 or more.

5. A memory device comprising the capacitor of claim 1 as a data storage member.

6. The memory device of claim 2, wherein the memory device is a DRAM (dynamic random access memory).

7. The capacitor of claim 1, wherein the TiO$_2$ element layer includes a plurality of TiO$_2$ nanodots, and the TiN member and the MoO$_2$ thin film are in direct contact in regions between the plurality of TiO$_2$ nanodots.

\* \* \* \* \*